US011333719B2

(12) United States Patent
Green et al.

(10) Patent No.: US 11,333,719 B2
(45) Date of Patent: May 17, 2022

(54) HALL-EFFECT SENSOR WITH REDUCED OFFSET VOLTAGE (71) Applicant: TEXAS INSTRUMENTS INCORPORATED, Dallas, TX (US)

(72) Inventors: Keith Ryan Green, Prosper, TX (US); Dimitar Trifonov, Vail, AZ (US); Tony Ray Larson, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 36 days.

(21) Appl. No.: 17/015,347

(22) Filed: Sep. 9, 2020

(65) Prior Publication Data
US 2022/0075007 A1 Mar. 10, 2022

(51) Int. Cl.
*G01R 33/07* (2006.01)
*H01L 43/06* (2006.01)
*G01R 33/00* (2006.01)
*H01L 43/04* (2006.01)
*H01L 43/14* (2006.01)

(52) U.S. Cl.
CPC ......... *G01R 33/07* (2013.01); *G01R 33/0052* (2013.01); *H01L 43/04* (2013.01); *H01L 43/065* (2013.01); *H01L 43/14* (2013.01)

(58) Field of Classification Search
CPC ..... G01R 33/07; G01R 33/0052; H01L 43/04; H01L 43/065; H01L 43/14
See application file for complete search history.

(56) References Cited

U.S. PATENT DOCUMENTS

| 6,768,301 | B1* | 7/2004 | Hohe | G01R 33/07 |
| | | | | 324/251 |
| 9,217,783 | B2* | 12/2015 | Kolb | H01L 43/065 |
| 9,395,422 | B2* | 7/2016 | Yamamoto | G01R 33/07 |
| 2013/0057256 | A1* | 3/2013 | Ernst | G01R 33/0005 |
| | | | | 324/202 |
| 2016/0097826 | A1* | 4/2016 | Ausserlechner | G01R 33/077 |
| | | | | 324/251 |
| 2017/0285116 | A1* | 10/2017 | Guo | G01R 33/07 |
| 2017/0288131 | A1* | 10/2017 | Sun | G01R 33/0052 |
| 2020/0300943 | A1* | 9/2020 | Yuan | G01R 33/0017 |

* cited by examiner

*Primary Examiner* — Dominic E Hawkins
(74) *Attorney, Agent, or Firm* — Andrew R. Ralston; Charles A. Brill; Frank D. Cimino (57) ABSTRACT A semiconductor device includes first and second Hall-effect sensors. Each sensor has first and third opposite terminals and second and fourth opposite terminals. A control circuit is configured to direct a current through the first and second sensors and to measure a corresponding Hall voltage of the first and second sensors. Directing includes applying a first source voltage in a first direction between the first and third terminals of the first sensor and applying a second source voltage in a second direction between the first and third terminals of the second sensor. A third source voltage is applied in a third direction between the second and fourth terminals of the first sensor, and a fourth source voltage is applied in a fourth direction between the second and fourth terminals of the second sensor. The third direction is rotated clockwise from the first direction and the fourth direction rotated counter-clockwise from the second direction.

20 Claims, 6 Drawing Sheets

HALL-EFFECT SENSOR WITH REDUCED OFFSET VOLTAGE

RELATED APPLICATIONS

This Application is related to U.S. patent application Ser. No. 17/015,327, filed on even date herewith, and incorporated by reference in its entirety. This Application is further related to U.S. patent application Ser. No. 16/576,963 and to U.S. patent application Ser. No. 16/888,927, each of which is incorporated herein by reference in its entirety.

TECHNICAL FIELD

This disclosure relates to the field of semiconductor devices, and more particularly, but not exclusively, to a Hall-effect sensor with reduced offset voltage.

BACKGROUND

Hall-effect sensors may be implemented as dedicated devices or integrated with other circuitry to provide measurement of magnetic fields for control purposes. Some example applications may measure angular displacement of a drive shaft, or measuring current flow. Some Hall-effect sensors are formed using processes compatible with forming MOS transistors, enabling the sensor to be formed on a same semiconductor substrate as is the associated circuitry.

SUMMARY

The inventors disclose various methods and devices that may be beneficially applied to Hall-effect sensors and systems. While such embodiments may be expected to provide improvements in performance and/or yield of such transistors and ICs, no particular result is a requirement of the present invention unless explicitly recited in a particular claim.

One example is a semiconductor device that includes first and second Hall-effect sensors in or over a semiconductor substrate. Each Hall-effect sensor has first and third opposite terminals and second and fourth opposite terminals. A control circuit includes timing, current driving, switching and measuring circuits configured to direct a current through the first and second Hall-effect sensors and to measure a corresponding Hall voltage of the first and second Hall-effect sensors. Directing the current through the Hall-effect sensors includes applying a first positive source voltage in a first direction between the first terminal and the third terminal of the first Hall-effect sensor and applying a second positive source voltage in a second direction between the first terminal and the third terminal of the second Hall-effect sensor. A third positive source voltage is applied in a third direction between the second terminal and the fourth terminal of the first Hall-effect sensor, and a fourth positive source voltage is applied in a fourth direction between the second terminal and the fourth terminal of the second Hall-effect sensor. The third direction is rotated clockwise (CW) from the first direction and the fourth direction rotated counter-clockwise (CCW) from the second direction.

BRIEF DESCRIPTION OF THE DRAWINGS

For a detailed description of various examples, reference will now be made to the accompanying drawings in which:

FIGS. 8A and 8B illustrate an example Hall-effect sensor system that includes an array including four instances of the Hall-effect sensor of FIG. 1A, in which FIG. 8A illustrates a first channel of the system and connections to a controller such as the control circuit of FIG. 4, and FIG. 8B illustrates a second channel of the system and connections to the control circuit.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

Figure 1A:
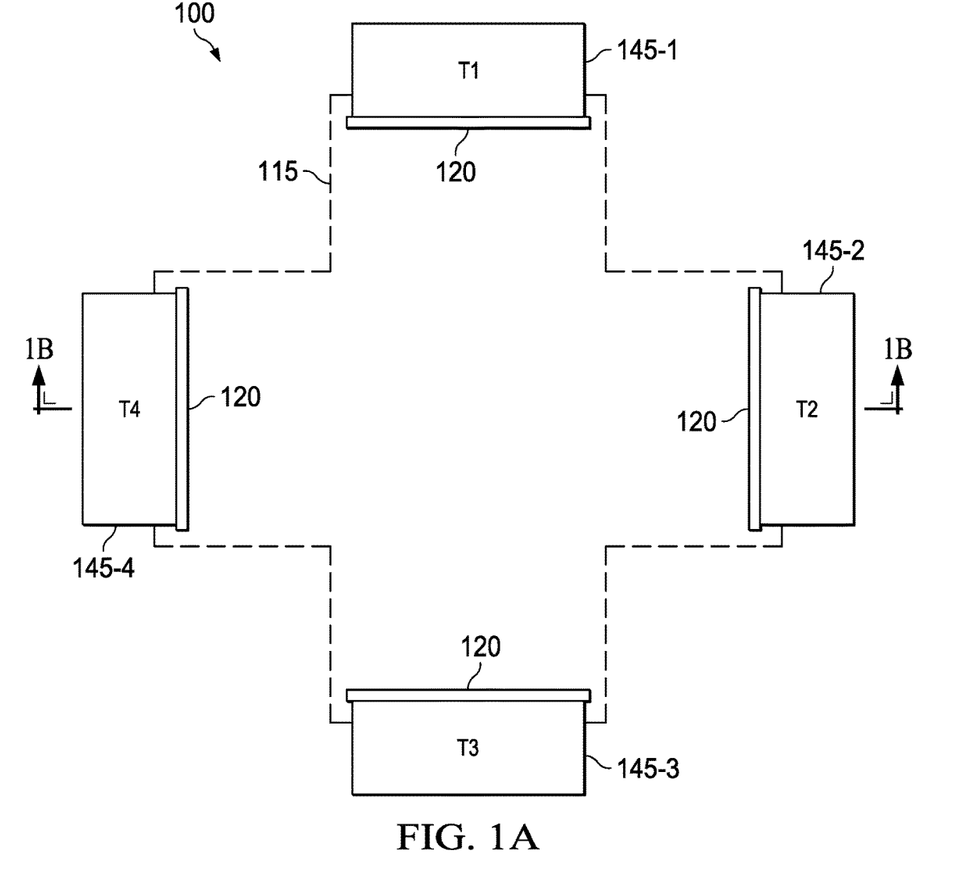
FIG. 1A presents a plan view of a Hall-effect sensor on a semiconductor substrate.
Figure 1B:
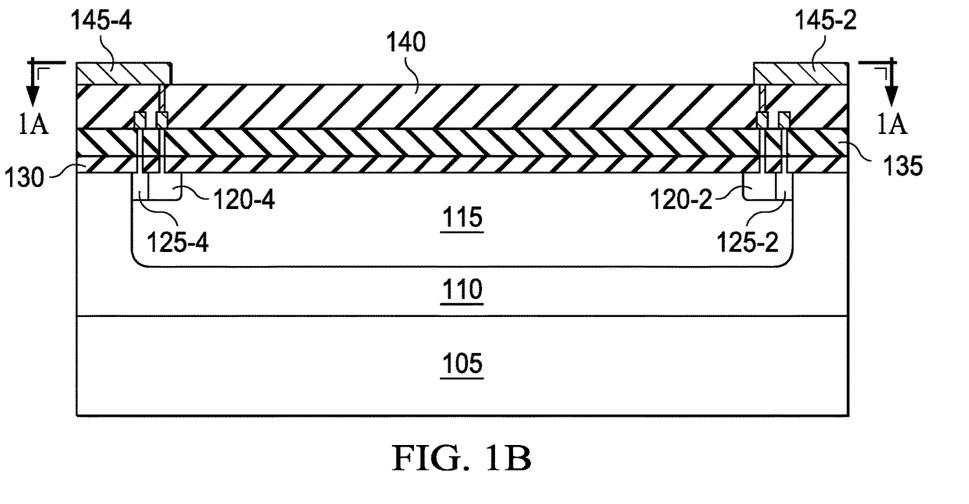
FIG. 1B presents a section view of the Hall-effect sensor at the cut line shown in FIG. 1A.
Figure 2A:
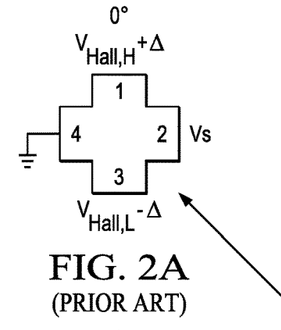
FIGS. 2A-2D illustrate measured Hall voltages determined at various terminals of a Hall-effect sensor using conventional rotation of device terminals.
Figure 2B:
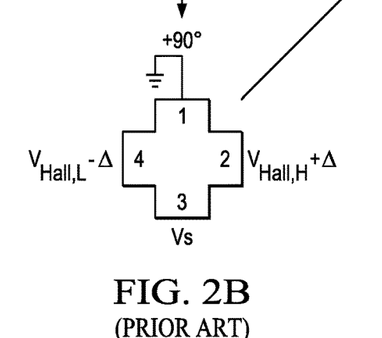
Figure 2C:
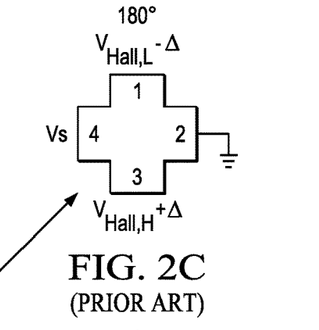
Figure 2D:
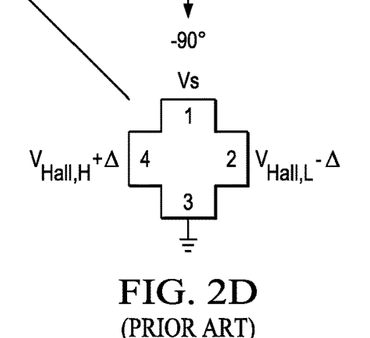
Figure 3A:
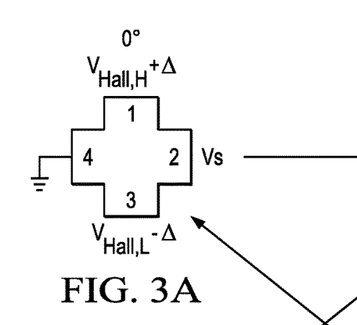
FIGS. 3A-3D illustrate measured Hall voltages determined at various terminals of the Hall-effect sensor of FIG. 1A for various orientations of current through the Hall-effect sensors, according to various examples of the disclosure.
Figure 3B:
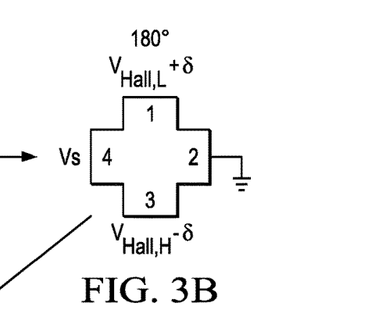
Figure 3C:
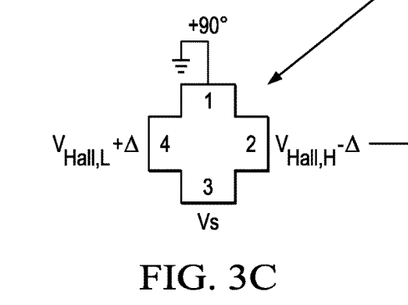
Figure 3D:
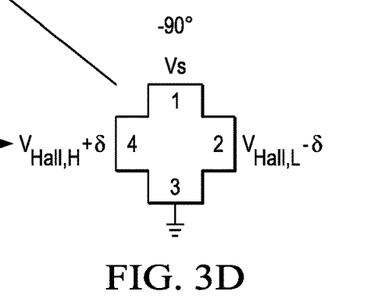

FIGS. 1A and 1B present a single Hall sensor 100 suitable in various implementations described herein. FIG. 1A illustrates the Hall sensor 100 in plan view, while FIG. 1B presents a sectional view as marked in FIG. 1A. Referring to FIG. 1B, the Hall sensor 100 is located over a substrate 105, e.g. a semiconductor wafer that may be doped p-type. An epitaxial layer 110 is located over the substrate 105, and may also be doped p-type, e.g. lightly doped. An n-type well 115 is formed within the epitaxial layer 110. The n-type well 115 may be referred to synonymously as a Hall well 115. The Hall well 115 may be moderately doped, e.g. with phosphorous at about $1E15\ cm^{-3}$ to $1E16\ cm^{-3}$. N-type regions 120-2 and 120-4 may be heavily doped, e.g. $1E18\ cm^{-3}$ or greater, to provide electrical contact to the Hall well 115. P-type regions 125-2 and 125-4 may be used to provide junction isolation of the Hall well 115. Additional details are described in U.S. Pat. No. 10,374,004, incorporated by reference herein in its entirety.

A dielectric layer 130 is located over the Hall well 115. In various implementations the dielectric layer includes a silicon dioxide layer formed by a shallow trench isolation (STI) process. Optionally the dielectric layer 130 may include a silicon dioxide layer formed by local oxidation of silicon (LOCOS). A silicon nitride layer may possibly be formed on the silicon dioxide layer. Additional dielectric layers 135 and 140 are located over the dielectric layer 130, and may serve as interconnect insulators, e.g. poly-metal dielectric or inter-metal dielectric. Terminals 145-2 and 145-4 are located over the dielectric layer 140, and each connects to the corresponding n-type region 120-2 or 120-4 by way of unreferenced vertical interconnections, e.g. vias and contacts. A portion of each n-type region 120-2, 120-4 that extends through the dielectric layer 130 may be heavily doped to provide an ohmic connection between the n-type regions 120-2, 120-4 and the corresponding contact.

Referring to FIG. 1A, the Hall well 115 is seen to form a "plus" or "cross" shape. For the purpose of the present discussion, a "plus" or "cross" shape refers to a dodecagon for which all vertices between adjacent sides are 90°. Each extension of the Hall well 115 from the central body may be referred to as an "arm" of the structure. The terminals 145-2 and 145-4 are each located on opposite arms, and terminals 145-1 and 145-3 are located on the remaining opposite arms. In this context, "opposite" means the arms are located at positions along a straight line that passes through the two terminals. For example, the terminals 145-2 and 145-4 may be viewed as lying on a horizontal axis of the figure, and the terminals 145-1 and 145-3 may be viewed as lying on a vertical axis of the figure. The terminals may be referred to herein as T1, T2, T3 and T4 for brevity. In other examples, not shown, the Hall well may be implemented in one of several other geometries, e.g. a square (or diamond), in which terminals may be at corners of the square. Optionally a peripheral isolation region may be used that serves to conductively isolate the Hall sensor 100 from neighboring Hall sensors or other circuit elements on a same substrate.

The basic operation of the Hall sensor 100 is well known, and thus described briefly. A voltage potential, sometimes referred to as a source or excitation voltage $V_s$, is placed across opposite arms of the device, e.g. T1 and T3, establishing a source or excitation current through the Hall well 115 between that terminal pair. Such a terminal pair may be referred to as "source terminals", while the remaining terminals, e.g. T2 and T4 may be referred to as "sense terminals". With no magnetic field a voltage at each of the sense terminals is typically about ½ $V_s$, and thus a voltage difference between the sense terminals is zero. In the presence of a magnetic field, current carriers, e.g. electrons, are deflected toward one of the terminals T2 or T4, creating a nonzero voltage between these terminals. A voltage between the sense terminals may be referred to as a "sense voltage" or "Hall voltage".

Measurement of a magnetic field by a Hall sensor may be subject to various errors resulting from offset effects. Various strategies may be used to reduce the contribution of such offset effects on the measured signal representing a magnetic field. One such strategy may be referred to as "spinning", in which a first pair of source terminals is used to generate a current in a first direction while measuring the Hall voltage on the sense terminals, and then reversing the role of source and sense terminals such that current is generated in a second direction orthogonal to the first, and the Hall voltage again measured. The term "spinning" refers to the clockwise (CW) or counterclockwise (CCW) rotation of the assigned role of the source and sense terminals. In this context, "clockwise" refers to a relative orientation of a second source voltage across first and second terminals of a Hall sensor relative to a first pair of terminals of the Hall sensor, as viewed looking down on the Hall sensor. For example, a second current directed from T2 to T4 of the Hall sensor 100 is considered rotated CW from the first current directed from T1 to T3 of the Hall sensor 100. Conversely, a second current directed from T4 to T2 of the Hall sensor 100 is considered rotated CCW from a first current directed from T1 to T3. For further clarification of nomenclature, the second measurement in the CW direction may described as being rotated 90° relative to the first measurement, and the second measurement in the CCW direction may described as being rotated −90° relative to the first measurement.

In some examples, the Hall sensor 100 may be measured four times, with the terminal that receives a source current changing +90° or −90° between each measurement. Each measurement period may be referred to as a "phase". The measured values are averaged to produce a final value for which bias effects are reduced. This type of measurement is sometimes referred to as "four-phase spinning". Some conventional measurement methods using only two-phase spinning are described in A. Bilotti, G. Monreal and R. Vig, "Monolithic magnetic Hall sensor using dynamic quadrature offset cancellation," in IEEE Journal of Solid-State Circuits, vol. 32, no. 6, pp. 829-836, June 1997, doi: 10.1109/4.585275, and V. Mosser, N. Matringe and Y. Haddab, "A Spinning Current Circuit for Hall Measurements Down to the Nanotesla Range," in IEEE Transactions on Instrumentation and Measurement, vol. 66, no. 4, pp. 637-650, April 2017, doi: 10.1109/TIM.2017.2649858, each of which is incorporated herein by reference in its entirety.

As a matter of convention in the following discussion, without implied limitation, angles of rotation are expressed as a positive value for CW and negative for CCW. Similarly, the angle between terminals is expressed as a positive value when a second terminal is CW from a first terminal, e.g. T4 relative to T1 of the Hall sensor 100. Further, the Hall sensor 100 is energized by a first greater source voltage $V_s$ at one terminal, e.g. T1, and a second lesser voltage at an opposite terminal, e.g. T3. Without implied limitation various examples are described with the greater voltage as $V_s$ and the lesser voltage as ground. The voltage measured at the terminal −90° from the $V_s$ terminal is defined as $V_{Hall,H}$, and the opposite terminal (90° from the $V_s$ terminal) is defined as $V_{Hall,L}$. The measured Hall voltage $V_{Hall}$ is defined as $V_{Hall,H} - V_{Hall,L}$. Of course, $V_{Hall}$ may be positive, negative, or zero, depending on the strength and direction of the local magnetic field. It is noted that in the absence of a magnetic field, each of $V_{Hall,H}$ and $V_{Hall,L}$ will be about $V_s/2$.

One conventional scheme of spinning the Hall sensor is illustrated in FIGS. 2A-2D. For additional background see, e.g. A. Udo, "Limits of offset cancellation by the principle of spinning current Hall probe," SENSORS, 2004 IEEE, Vienna, 2004, pp. 1117-1120 vol. 3, doi: 10.1109/ICSENS.2004.1426372, incorporated herein by reference in its entirety. Four measurements are taken cyclically using different orientations of the excitation voltage placed across two opposite terminals while measuring the Hall voltage on the remaining two opposite terminals. Continuing to use the terminal numbers illustrated in FIG. 1A, in a first phase excitation voltage $V_s$ is placed on T2 and T4 is grounded. For the purpose of discussion this configuration is designated as 0°. A first Hall voltage is obtained between T1 and T3. In a second measurement (FIG. 2B), $V_s$ is placed across T3 and T1. This configuration is designated as +90°. A second Hall voltage is obtained between T2 and T4. In a third measurement (FIG. 2C), $V_s$ is placed across T4 and T2. This configuration is designated as 180°, and a Hall voltage is obtained between T3 and T1. In a fourth measurement (FIG. 2D), $V_s$ is placed on T1, and T3 is grounded. This configuration is designated as 90°, and a Hall voltage is obtained between T4 and T2.

The inventors have determined that the voltage across the sense terminals is influenced by the excitation voltage on those terminals in their previous state, e.g. a history effect. Thus, in the conventional scheme, each of the Hall voltages includes an offset A. Without implied limitation this effect is understood as possibly resulting from a dielectric absorption process related to the presence of one or more of the dielectric layers 130, 135 and 140 (FIG. 1B), or a parasitic bipolar transistor effect. In the conventional spinning scheme, the terminal defined as $V_{Hall,H}$ in a current phase was held at $V_s$ in the immediately previous phase, and the terminal defined as $V_{Hall,L}$ in the current phase was grounded in the immediately previous phase. Due to the history effect, $V_{Hall,H}$ includes a small positive offset voltage, while $V_{Hall,L}$ includes a small negative offset voltage. It is believed that, whatever the responsible physical mechanism, this effect may have a time constant on the order of about one microsecond. Thus the term A may be referred to as a "transient offset". In principle the time between measurements may be long enough that the transient offset decays to zero when $V_{Hall}$ is measured. However, typically a designer prefers to operate the measurement cycle at a high enough frequency that 1/f noise is not significant, and this frequency typically has a period less than the decay time of the transient offset. Thus, when the four Hall voltages conventionally determined in FIGS. 2A-2D are averaged, a net offset of 2Δ may result. To the best of the inventors' knowledge, this work is the first recognition of this transient offset phenomenon.

The inventors have determined that the measurement error resulting from such a history effect may be reduced in the case of a single measurement channel by using a new four-phase spinning scheme that substantially cancels the transient offset. In this methodology, four measurements are obtained from a Hall sensor, e.g. the Hall sensor 100, in a systematic fashion in which the source and ground terminals are interchanged between a first measurement phase and an immediately following second measurement phase. After the second measurement, the source and ground terminals are reassigned as measurement terminals, and the terminals used for measurement in the first and second measurements are reassigned as source and ground terminals. Then the Hall voltage is measured in a third measurement phase and an immediately following and fourth measurement phase, with the source and ground terminals interchanged between these measurements. In this manner, the effect of the transient offset may be substantially reduced.

This principle is illustrated in FIGS. 3A-3D. Continuing to use the terminal numbers illustrated in FIG. 1A, in a first measurement, FIG. 3A, excitation voltage $V_s$ is placed on T2 and T4 is grounded. As before this configuration is designated as 0°. A first Hall voltage is obtained between T1 and T3. In a second measurement (FIG. 3B), $V_s$ is placed from T4 to T2. This configuration is designated as 180° rotation. A second Hall voltage is obtained between T3 and T1. In a third measurement (FIG. 3C), $V_s$ is placed on T3, and T1 is grounded. This configuration may be designated as 90° rotation, and a Hall voltage is obtained between T2 and T4. In a fourth measurement (FIG. 2D), $V_s$ is placed on T1, and T3 is grounded. This configuration may be designated as −90°, and a Hall voltage is obtained between T4 and T2.

In each of the measurements of the Hall sensor of FIGS. 3A-3D, a transient offset voltage is present at the $V_{Hall,H}$ terminal and at the $V_{Hall,L}$ terminal. As described previously this offset voltage may be caused by a dielectric polarization effect. While the offset at the $V_{Hall,H}$ terminal and at the $V_{Hall,L}$ terminal are described as "A", the offset at these terminals may be different. Regarding the transition from +90° rotation (FIG. 3D) to 0° rotation (FIG. 3A), T1 was held at $V_s$ during the +90° rotation, and T3 was held at ground. Due to the transient-induced offset, the voltage measured at T1 during the 0° phase is $V_{Hall,H}+\Delta$, and the voltage measured at T3 is $V_{Hall,L}-\Delta$. In the 180° phase T4 is held at $V_s$, and T2 is held at ground. While the assignments of T1 and T3 are reversed, the transient-induced offset may remain from the transition from the +90° phase to the 0° phase. Due to relaxation of the effect, the magnitude of the offset may decline to δ, so the voltage measured at T1 is $V_{Hall,L}+\delta$, and the voltage measured at T3 is $V_{Hall,H}-\delta$. When the Hall-effect sensor 100 transitions to the 90° phase, T4 will experience a positive transient-induced offset, and T2 will experience a negative transient-induced offset. Thus the voltage measured at T4 is $V_{Hall,L}+\Delta$ and the voltage measured at T2 is $V_{Hall,H}-\Delta$. After the transition to the −90° phase (FIG. 3D), T4 and T2 will continue to experience a positive and negative offset, respectively, which possibly relaxes to a lower value. Thus the voltage measured at T4 is $V_{Hall,H}+\beta$ and the voltage measured at T2 is $V_{Hall,L}-\delta$.

The four measured values are then averaged to obtain a final value representing a detected magnetic field. The following equation illustrates the computation:

$$V_{Avg} = \frac{\{(V_{Hall,H}+\Delta)-(V_{Hall,L}-\Delta)\}+\{(V_{Hall,H}+\delta)-(V_{Hall,L}-\delta)\}+\{(V_{Hall,H}-\Delta)-(V_{Hall,L}+\Delta)\}+\{(V_{Hall,H}+\delta)-(V_{Hall,L}-\delta)\}}{4} =$$

$$V_{Hall,H} - V_{Hall,L}$$

As illustrated by this equation, the offset values A and δ cancel out and are thus removed from the final value determined for the Hall voltage, and thus the measurement of the magnetic field can be expected to be more accurate than the conventional method of FIGS. 2A-2D.

Figure 4:
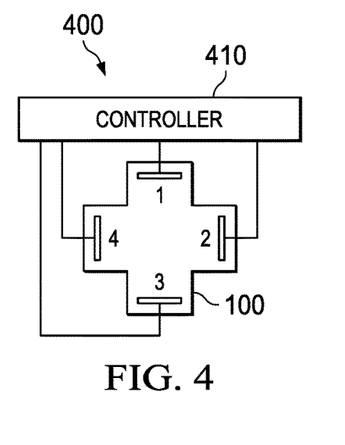
FIG. 4 illustrates an example of a Hall-effect sensor connected to a control circuit configured to direct current through the sensor in various directions, while measuring a Hall voltage in a direction different from the direction of current flow.

FIG. 4 illustrates a system 400, e.g. an integrated circuit, including a representative Hall sensor, e.g. the Hall sensor 100, connected to a control circuit, or controller, 410. The components of the system 400 may optionally be implemented as an integrated circuit on a single semiconductor substrate. The control circuit 400 is configured to apply voltages to T1-T4 in a desired order and to measure the resulting Hall voltage on the remaining terminals, e.g. to implement the measurement scheme illustrated in FIG. 3. One measurement cycle may include phases of a periodic measurement sequence. The control circuit 410 may include any suitable combination of circuit elements to implement the illustrated connectivity and described functionality. The specifics of such implementations are well within the ability of one skilled in the pertinent art.

Figure 5:
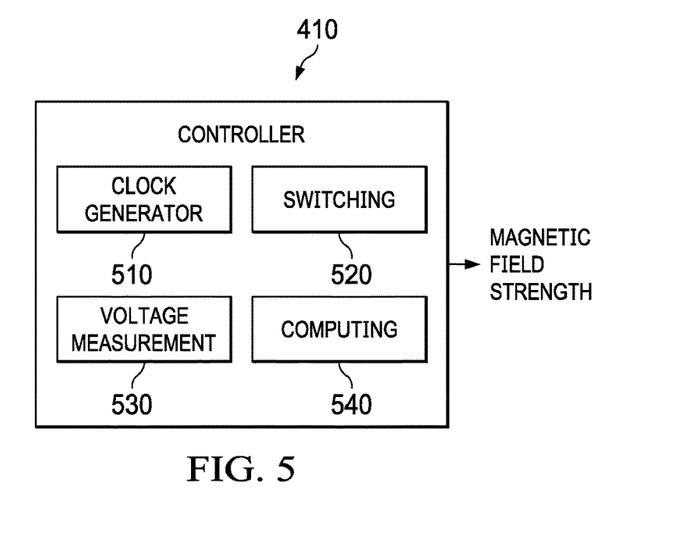
FIG. 5 illustrates an example control circuit that may be used in various examples, including a clock generator, current switching matrix, voltage measurement, and measurement processing, e.g. averaging.

FIG. 5 illustrates a representative system-level diagram of the control circuit 410. A clock generator 510 provides timing signals to mediate the operation of other functions of the control circuit 410. A switching circuit 520 provides the necessary switching elements to configure outputs of the controller 400 to provide $V_s$ and ground to the appropriate terminals of the Hall sensor 100, and to receive voltages from appropriate terminals of the Hall sensor 100. A voltage measurement circuit 530 includes necessary components to determine the voltage of the selected terminals of the Hall sensor 100, and may include, e.g. op-amps and resistors configured to perform this function. And a computing circuit 540 includes necessary components to determine compute a Hall voltage and/or magnetic field strength from the voltage values determine from the Hall sensor 100, and may include, e.g. op-amps, resistors, A/D converters, memory and/or an arithmetic processing unit configured to perform this function. The controller 410 outputs a value representative of the strength of the local magnetic field perceived by the Hall sensor 100 in an appropriate format, e.g. a voltage or current in an analog or digital format.

Figure 6:
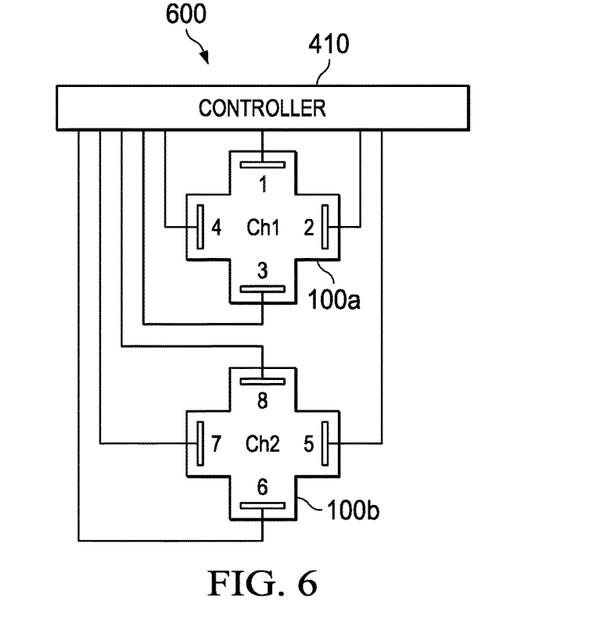
FIG. 6 illustrates an example Hall-effect sensor system that includes an array of two instances of the Hall-effect sensor of FIG. 1, and a control circuit such as shown in FIG. 4.

FIG. 6 illustrates an implementation of a Hall sensor system 600, e.g. an integrated circuit, which includes two channels (Ch1 and Ch2). Two channels may be desirable in some cases, for example for drift compensation. In such an implementation, each channel may be rotated (spun), by rotating the $V_s$/ground terminal assignments in 90° increments between measurements, or using the method described with respect to FIGS. 3A-3D. However, it was determined by the inventors that spinning the channels in different directions (e.g. CW for Ch1 and CCW for Ch2) may also substantially reduce the effect of transient offset of the two channels.

Figure 7A:
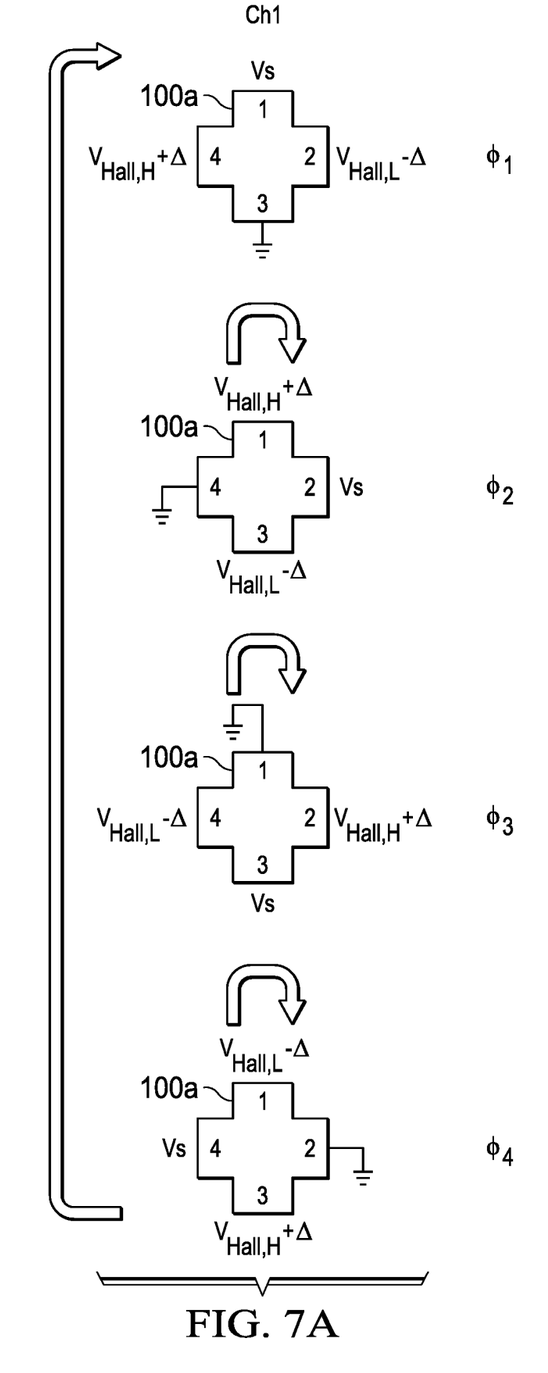
FIGS. 7A and 7B illustrate voltages at the terminals of the Hall-effect sensors of FIG. 6 as one Hall-effect sensor is "spun" clockwise, and the other Hall-effect sensor is spun counter-clockwise.
Figure 7B:
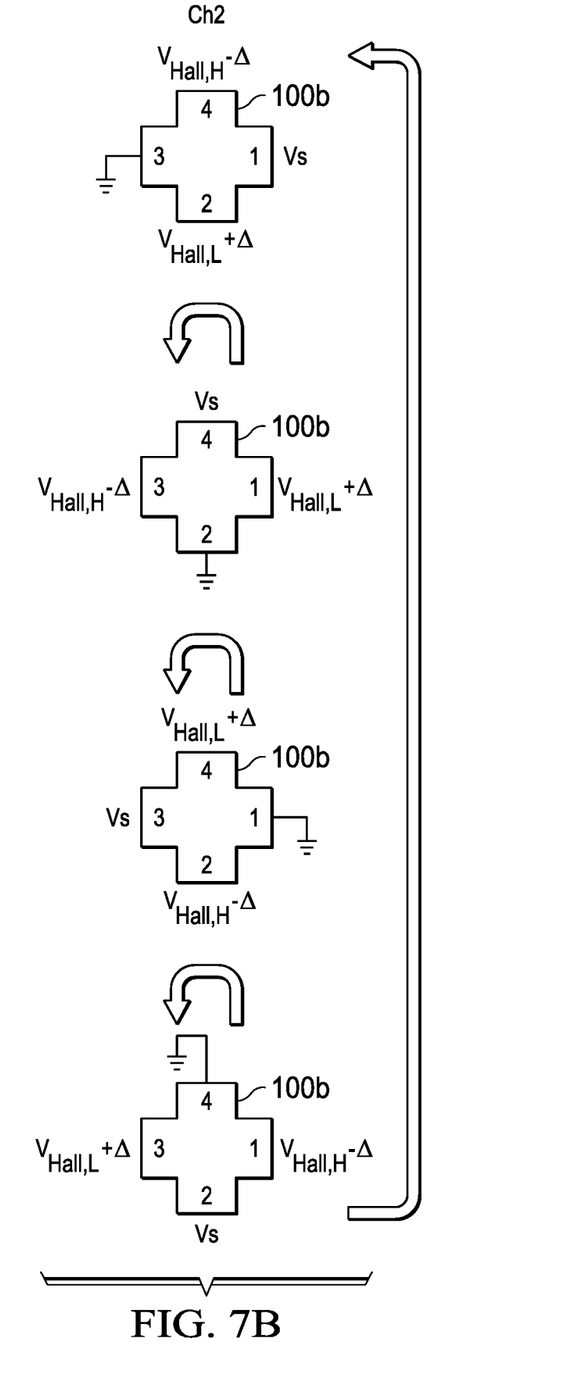

FIGS. 7A and 7B illustrate one example of implementation of this novel strategy. FIG. 7A describes a sequence of configurations of a first Hall sensor 100a in a first channel CH1, and FIG. 7B describes a sequence of configurations of a second Hall sensor 100b in a second channel Ch2. The illustrated system configuration is denoted "dual-single", reflecting one Hall sensor in each of two channels. Each sequence of configurations is described by a phase number, $\varphi_1$, $\varphi_2$, $\varphi_3$ and $\varphi_4$. The progression of the phases in some examples is cyclical, so the configuration illustrated by $\varphi_1$ may immediately follow a previous configuration described by $\varphi_4$ of each cycle.

Considering first the progression of phases of the Ch1 Hall sensor 100a in FIG. 7A, in phase $\varphi_1$, $V_s$ is applied to T1 and T3 is grounded, while a Hall voltage is sensed between T4 and T2. Terminal T4 was held at $V_s$ in the previous phase ($\varphi_4$), so the Hall voltage measured at T4 in $\varphi_1$ may have a positive transient offset +Δ. Terminal T2 was held at ground during phase $\varphi_4$, so the Hall voltage measured at T2 in $\varphi_1$ may have a negative transient offset −Δ. During phase $\varphi_2$, the terminal assignments of the Hall sensor 100a are rotated 90° CW, so T2 is held at $V_s$, terminal T4 is grounded, and a Hall voltage is sensed between T1 and T3. Since terminal T1 was held at $V_s$ in phase $\varphi_1$, the Hall voltage measured at T1 in $\varphi_2$ may have a positive transient offset, while terminal T3, held at ground during phase $\varphi_1$, may have a negative transient offset. The terminal assignments of the Hall sensor 100a are rotated similarly in phases $\varphi_3$ and $\varphi_4$, with each Hall voltage measurement during these phases similarly affected by the transient offset +Δ.

Now considering FIG. 7B, the progression of phases in Ch2 Hall sensor 100b is shown. In phase $\varphi_1$ terminal T1 is held at $V_s$, T2 is grounded, and a Hall voltage is determined between T4 and T2. In an optional configuration, as shown, the terminal assignments of the Ch2 Hall sensor 100a are rotated 90° relative to the terminal assignments of the Ch1 Hall sensor 100b. Such a configuration may be beneficial for offset and/or drift compensation, as previously mentioned. The terminals T2 and T4 are affected by the phase $\varphi_4$, in which T2 was held at $V_s$ and T4 was grounded. Thus the measured voltage at T2 experiences a positive transient offset, while the voltage at terminal T4 experiences a negative transient offset. Thus the voltage at T4 is $V_{Hall,H}$−Δ and the measured voltage at T2 is $V_{Hall,L}$+Δ. In phase $\varphi_2$, the terminal assignments of the Hall sensor 100 are rotated 90° CCW (−90°). Thus the voltage at T3, which was held at ground in phase $\varphi_1$, is $V_{Hall,H}$−Δ, while the voltage at terminal T1 is $V_{Hall,L}$+Δ. Similarly, in phase $\varphi_3$ the voltage at T2 is $V_{Hall,H}$−Δ and the voltage at T4 is $V_{Hall,L}$+Δ, and in phase $\varphi_4$ the voltage at T1 is $V_{Hall,H}$−Δ and the voltage at T3 is $V_{Hall,L}$+Δ.

A computed Hall voltage, or magnetic field strength, may be determined by the eight voltage measurements, four from Ch1 and four from Ch2. Table I below summarizes for one representative example the position of the terminals energized with $V_s$ for each of the Hall sensors 100a and 100b relative to 0° of standard polar coordinates. This example illustrates that the excitation voltage $V_s$ is directed in each orthogonal direction of the Hall sensors 100 over the course of four measurement cycles. A measure of the local magnetic field detected by the system 600 may be computed as an average of the 16 measured values, e.g. Eqs. 1 and 2:

$$V = \{4[(V_{Hall,H}+\Delta)-(V_{Hall,L}-\Delta)]+4[(V_{Hall,H}-\Delta)-(V_{Hall,L}+\Delta)]\}/8 \quad (1)$$

$$V = V_{Hall,H} - V_{Hall,L} \quad (2)$$

TABLE I

| Phase $\varphi$ | Ch1 | | Ch2 | |
|---|---|---|---|---|
| 1 | −90° | $(V_{Hall,H} + \Delta) - (V_{Hall,L} - \Delta)$ | 0° | $(V_{Hall,H} - \Delta) - (V_{Hall,L} + \Delta)$ |
| 2 | 0° | $V_{Hall,H} + \Delta) - (V_{Hall,L} - \Delta)$ | −90° | $(V_{Hall,H} - \Delta) - (V_{Hall,L} + \Delta)$ |
| 3 | +90° | $V_{Hall,H} + \Delta) - (V_{Hall,L} - \Delta)$ | 180° | $(V_{Hall,H} - \Delta) - (V_{Hall,L} + \Delta)$ |
| 4 | 180° | $V_{Hall,H} + \Delta) - (V_{Hall,L} - \Delta)$ | +90° | $(V_{Hall,H} - \Delta) - (V_{Hall,L} + \Delta)$ |

Figure 8A:
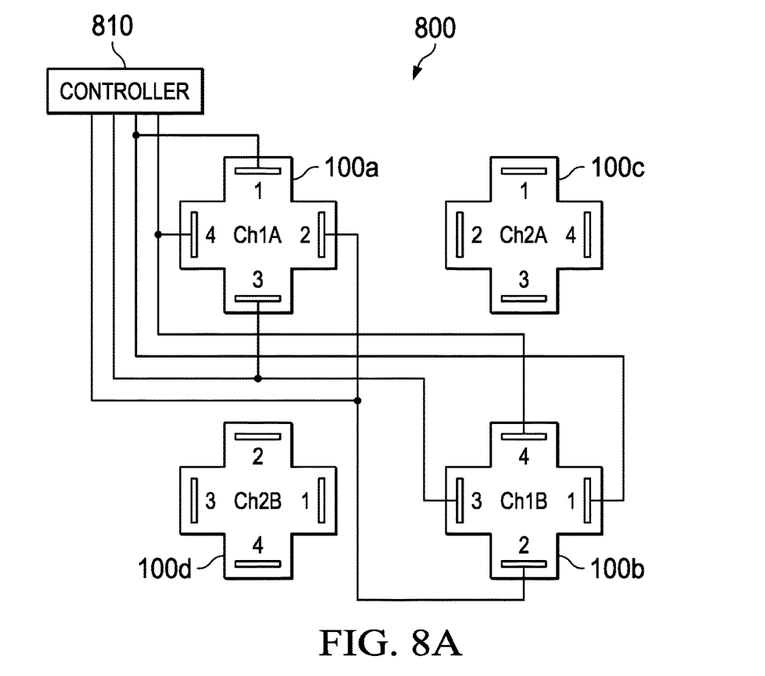
Figure 8B:
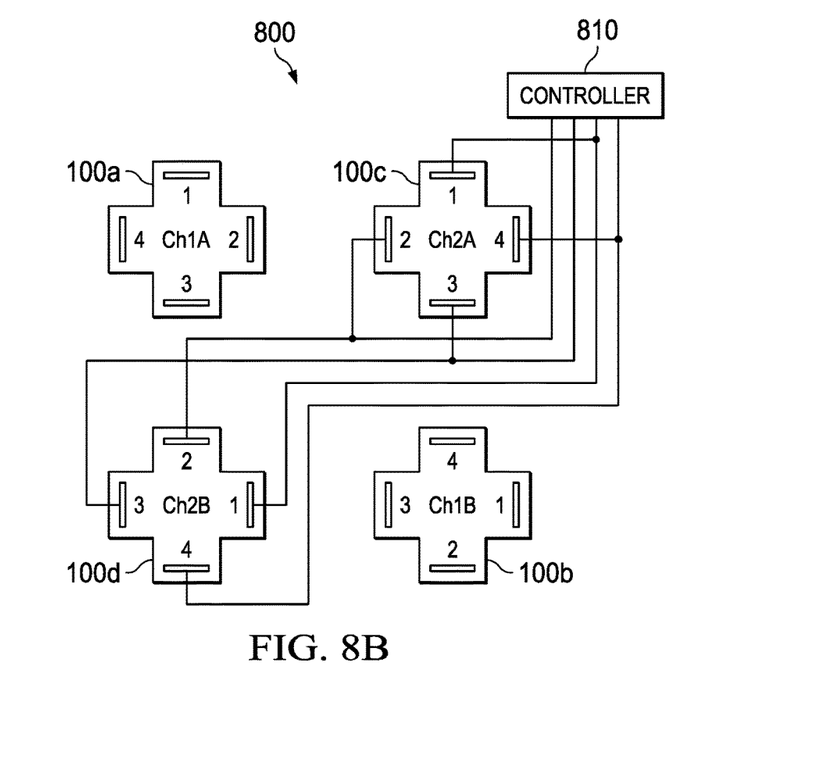

Turning now to FIGS. 8A and 8B, a system 800, e.g. implemented as an integrated circuit, is shown. The figures together describe a single system 800, but are separated to view a first channel, Ch1 (FIG. 8A), and a second channel, Ch2 (FIG. 8B) for clarity. Each channel includes two Hall sensors, e.g. two instances of the Hall sensor 100. Such a system may be referred to as a "dual-dual" Hall sensor system. The first channel, FIG. 8A, includes a first Hall sensor 100a (also denoted Ch1A) and a second Hall sensor 100b (also denoted Ch1B). In a nonlimiting example terminal assignments of the Hall sensor 100b are rotated 90° CW from those of the Hall sensor 100a. The terminal assignments of the channels Ch1A and Ch1B increment in a CW fashion for convenience of discussion. The second channel, FIG. 8B, includes a third Hall sensor 100c (also denoted Ch2A) and a fourth Hall sensor 100d (also denoted Ch2B). In a nonlimiting example terminal assignments of the Hall sensor 100d are rotated 90° CW from those of the Hall sensor 100c. Such an arrangement may be advantageous in some circumstances, e.g. to substantially cancel biases resulting from physical homogeneities in the media in which the Hall sensors 100a . . . 100d are implemented. The terminal assignments of the channels Ch2A and Ch2B increment in a CCW fashion for convenience of discussion.

A control circuit 800 is configured to apply voltage and ground to selected terminals of the Hall sensors 100a . . . 100d in a predetermined order, and to determine the voltage at selected terminals of the Hall sensors 100a . . . 100d in a corresponding predetermined order. In a first phase the controller applies $V_s$ to a first terminal, e.g. T1, and ground to a second opposite terminal, e.g. T3, of each of the Hall sensors 100a and 100b. In the same phase the controller also applies $V_s$ to a first terminal, e.g. T1, and ground to a second opposite terminal, e.g. T3, of each of the Hall sensors 100c and 100d. In a second phase the controller applies $V_s$ to a third terminal, e.g. T2, and ground to a fourth opposite terminal, e.g. T4, of each of the Hall sensors 100a . . . 100d. Note that the terminal to which $V_s$ is directed rotates in the CW direction for Ch1A and Ch1B, while the terminal to which $V_s$ is directed rotates in the CCW direction for Ch2A and Ch2B, Similarly, in a third phase and a fourth phase the energized terminals of the channel 1 Hall sensors 100 progress in CW fashion, and those of the channel 2 Hall sensors 100 progress in CCW fashion.

Figure 9A:
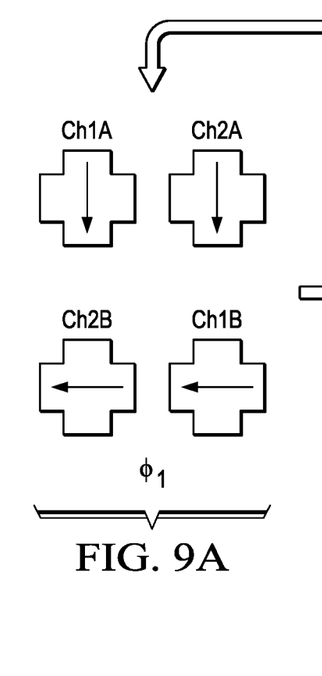
FIGS. 9A-9D illustrate direction of current through the Hall-effect sensors of the system of FIGS. 8A and 8B, for four phases as the Hall-effect sensors of the first channel are spun counter-clockwise and the Hall-effect sensors of the second channel are spun clockwise.
Figure 9B:
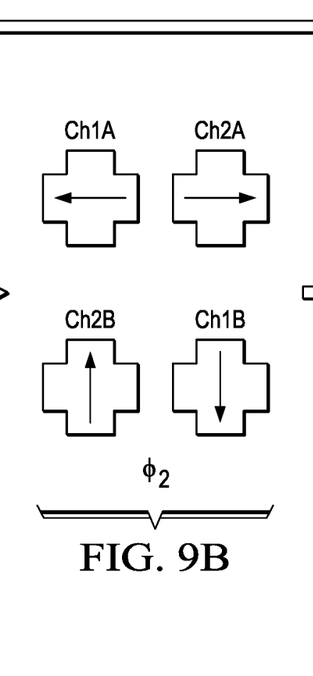
Figure 9C:
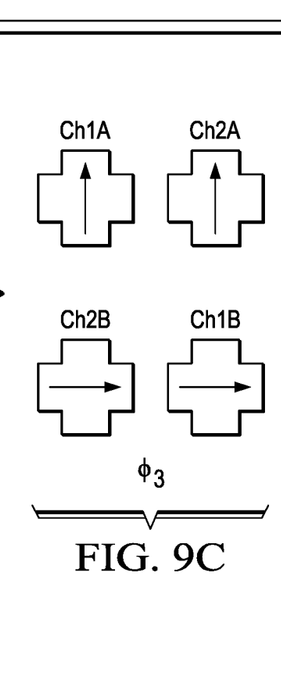
Figure 9D:
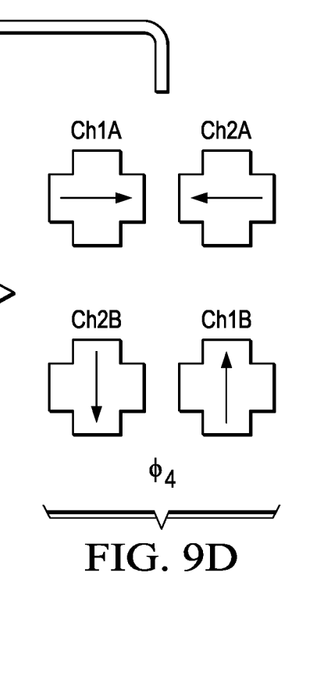

FIGS. 9A-9D illustrate the direction of voltage applied to the Hall detectors 100a . . . 100d as vectors, each directed in one of four directions 0°, ±90° and 180°. The initial vectors orientations in FIG. 9A are presented without implied limitation. Each of the vectors of the Ch1 Hall sensors 100 are seen to rotate CW from one phase to the next phase, while the vectors of the CH 2 Hall sensors 100 are seen to rotate CCW.

Because the two Hall sensors in each channel of the system 900 are energized and measured in parallel, the transient offsets at each terminal of one Hall sensor to not add, and Eqs. 1 and 2 may be used to determine the computed Hall voltage. Experimental data based on manufactured devices demonstrates a median offset voltage in a system consistent with FIGS. 8A and 8B reduced by a factor of 8 (about 90%) from the offset measured in a system consistent with FIG. 6.

It is noted that examples consistent with the disclosure are not limited to a maximum of two Hall sensors per channel. In principle the number has no limit, but in practice there may be marginal utility in using more than four Hall sensors in each channel. In such a system each Hall sensor in each channel may be excited by a voltage directed in one of four different directions, each direction differing from the other directions by a multiple of 90°. Such a system, denoted "dual-quad", may be expected to further reduce offset and/or drift of a computed Hall voltage relative to that of the dual-dual system, but at the expense of increase device die area and excitation current requirements.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of manufacturing a magnetic field sensor, comprising:

forming first and second Hall-effect sensors in a semiconductor layer, each Hall-effect sensor having first and third opposite terminals and second and fourth opposite terminals;

forming a control circuit on or over the semiconductor layer, the control circuit including timing, current driving, switching and measuring circuits configured to direct a current through the first and second Hall-effect sensors and to measure a corresponding Hall voltage of the first and second Hall-effect sensors, wherein directing the current through the Hall-effect sensors includes:

applying a first positive source voltage in a first direction between the first terminal and the third terminal of the first Hall-effect sensor and applying a second positive source voltage in a second direction between the first terminal and the third terminal of the second Hall-effect sensor;

after applying the first and second positive source voltages, applying a third positive source voltage in a third direction between the second terminal and the fourth terminal of the first Hall-effect sensor and applying a fourth positive source voltage in a fourth direction between the second terminal and the fourth terminal of the second Hall-effect sensor, the third direction rotated clockwise (CW) from the first direction and the fourth direction rotated counterclockwise (CCW) from the second direction.

2. The method of claim 1, further comprising configuring the control circuit to:

determine a first Hall voltage of the first Hall-effect sensor after applying the first positive source voltage;

determine a second Hall voltage of the second Hall-effect sensor after applying the second positive source voltage;

determine a third Hall voltage of the first Hall-effect sensor after applying the third positive source voltage;

determine a fourth Hall voltage of the second Hall-effect sensor after applying the fourth positive source voltage;

determining a value of a magnetic field based on the first, second, third and fourth Hall voltages.

3. The method of claim 1, wherein the first direction is different from the second direction.

4. The method of claim 1, wherein the first direction is 90° different from the third direction.

5. The method of claim 1, wherein the control circuit is further configured to:

apply a fifth positive source voltage in a fifth direction between the first terminal and the third terminal of the first Hall-effect sensor and applying a sixth positive source voltage in a sixth direction between the first terminal and the third terminal of the second Hall-effect sensor, the fifth direction different from the third direction and the sixth direction different from the fourth direction.

6. The method of claim 5, wherein the fifth direction is opposite the first direction, and the sixth direction is opposite the second direction.

7. The method of claim 5, wherein the control circuit is further configured to:

apply a seventh positive source voltage in a seventh direction between the second terminal and the fourth terminal of the first Hall-effect sensor and applying an eighth positive source voltage in an eighth direction between the second terminal and the fourth terminal of the second Hall-effect sensor, the seventh direction opposite the third direction and the eighth direction opposite the fourth direction.

8. The method of claim 1, wherein first, second, third, fourth, fifth, sixth, seventh and eighth source voltages are about equal.

9. The method of claim 1, wherein forming the Hall-effect sensors includes forming an n-type well in a p-type epitaxial layer over a semiconductor substrate, and forming a silicon oxide layer directly on the n-type well.

10. The method of claim 1, wherein the Hall-effect sensor has a cross form factor.

11. A semiconductor device, comprising:
    first and second Hall-effect sensors in or over a semiconductor layer, each Hall-effect sensor having first and third opposite terminals and second and fourth opposite terminals;
    a control circuit on or over the semiconductor layer, the control circuit including timing, current driving, switching and measuring circuits configured to direct a current through the first and second Hall-effect sensors and to measure a corresponding Hall voltage of the first and second Hall-effect sensors, wherein directing the current through the Hall-effect sensors includes:
        applying a first positive source voltage in a first direction between the first terminal and the third terminal of the first Hall-effect sensor and applying a second positive source voltage in a second direction between the first terminal and the third terminal of the second Hall-effect sensor;
        applying a third positive source voltage in a third direction between the second terminal and the fourth terminal of the first Hall-effect sensor and applying a fourth positive source voltage in a fourth direction between the second terminal and the fourth terminal of the second Hall-effect sensor, the third direction rotated clockwise (CV) from the first direction and the fourth direction rotated counter-clockwise (CCW) from the second direction.

12. The semiconductor device of claim 11, wherein the control circuit is further configured to:
    determine a first Hall voltage of the first Hall-effect sensor after applying the first positive source voltage;
    determine a second Hall voltage of the second Hall-effect sensor after applying the second positive source voltage;
    determine a third Hall voltage of the first Hall-effect sensor after applying the third positive source voltage;
    determine a fourth Hall voltage of the second Hall-effect sensor after applying the fourth positive source voltage;
    determining a value of a magnetic field based on the first, second, third and fourth Hall voltages.

13. The semiconductor device of claim 11, wherein the first direction is different from the second direction.

14. The semiconductor device of claim 11, wherein the first direction is 90° different from the third direction.

15. The semiconductor device of claim 11, wherein the control circuit is further configured to:
    apply a fifth positive source voltage in a fifth direction between the first terminal and the third terminal of the first Hall-effect sensor and applying a sixth positive source voltage in a sixth direction between the first terminal and the third terminal of the second Hall-effect sensor, the fifth direction different from the third direction and the sixth direction different from the fourth direction.

16. The semiconductor device of claim 15, wherein the fifth direction is opposite the first direction, and the sixth direction is opposite the second direction.

17. The semiconductor device of claim 15, wherein the control circuit is further configured to:
    apply a seventh positive source voltage in a seventh direction between the second terminal and the fourth terminal of the first Hall-effect sensor and applying an eighth positive source voltage in an eighth direction between the second terminal and the fourth terminal of the second Hall-effect sensor, the seventh direction opposite the third direction and the eighth direction opposite the fourth direction.

18. The semiconductor device of claim 11, wherein first, second, third, fourth, fifth, sixth, seventh and eighth source voltage are about equal.

19. The semiconductor device of claim 11, wherein the Hall-effect sensor includes an n-type well in a p-type epitaxial layer over a semiconductor substrate, and a silicon oxide layer directly on the n-type well.

20. The semiconductor device of claim 11, wherein the Hall-effect sensor has a cross form factor.

* * * * *